United States Patent
Friebe et al.

(10) Patent No.: US 6,486,699 B1
(45) Date of Patent: Nov. 26, 2002

(54) COMPENSATION CIRCUIT FOR DRIVER CIRCUITS

(75) Inventors: Dirk Friebe, Munich (DE); Anthony Sanders, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/936,068

(22) PCT Filed: Mar. 1, 2000

(86) PCT No.: PCT/DE00/00592
§ 371 (c)(1),
(2), (4) Date: Dec. 19, 2001

(87) PCT Pub. No.: WO00/54408
PCT Pub. Date: Sep. 14, 2000

(30) Foreign Application Priority Data

Mar. 9, 1999 (DE) .......................................... 199 10 352

(51) Int. Cl.[7] .............................................. H03K 17/16
(52) U.S. Cl. ............................... 326/32; 326/82; 326/83
(58) Field of Search ............................... 326/32, 82, 83, 326/86, 87

(56) References Cited

U.S. PATENT DOCUMENTS

| | | | |
|---|---|---|---|
| 4,992,677 A | * | 2/1991 | Ishibashi et al. ............... 326/27 |
| 5,111,081 A | | 5/1992 | Atallah |
| 5,703,517 A | | 12/1997 | Houston |
| 6,031,389 A | * | 2/2000 | Fotouhi et al. ............... 326/31 |
| 6,160,423 A | * | 12/2000 | Haq ............................. 326/30 |

FOREIGN PATENT DOCUMENTS

| | | |
|---|---|---|
| EP | 0714167 | 5/1996 |
| EP | 0765037 | 3/1997 |

* cited by examiner

*Primary Examiner*—Don Phu Le
(74) *Attorney, Agent, or Firm*—Welsh & Katz, Ltd.

(57) ABSTRACT

The invention relates to a compensation circuit for driver circuits having a current reference source which generates at least one reference signal which is modulated with respect to an input signal, having a current-comparison source which generates at least one comparison signal which is modulated with respect to the input signal, the modulated comparison signals having an inverse characteristic to that of the modulated reference signals in respect of the parameters to be modulated, having a comparison unit to which the modulated reference signals and the modulated comparison signals are fed and which generates from a comparison of these modulated modulating signals at least one digital output signal which can be fed to driver circuits connected downstream.

8 Claims, 2 Drawing Sheets

Figure 1:
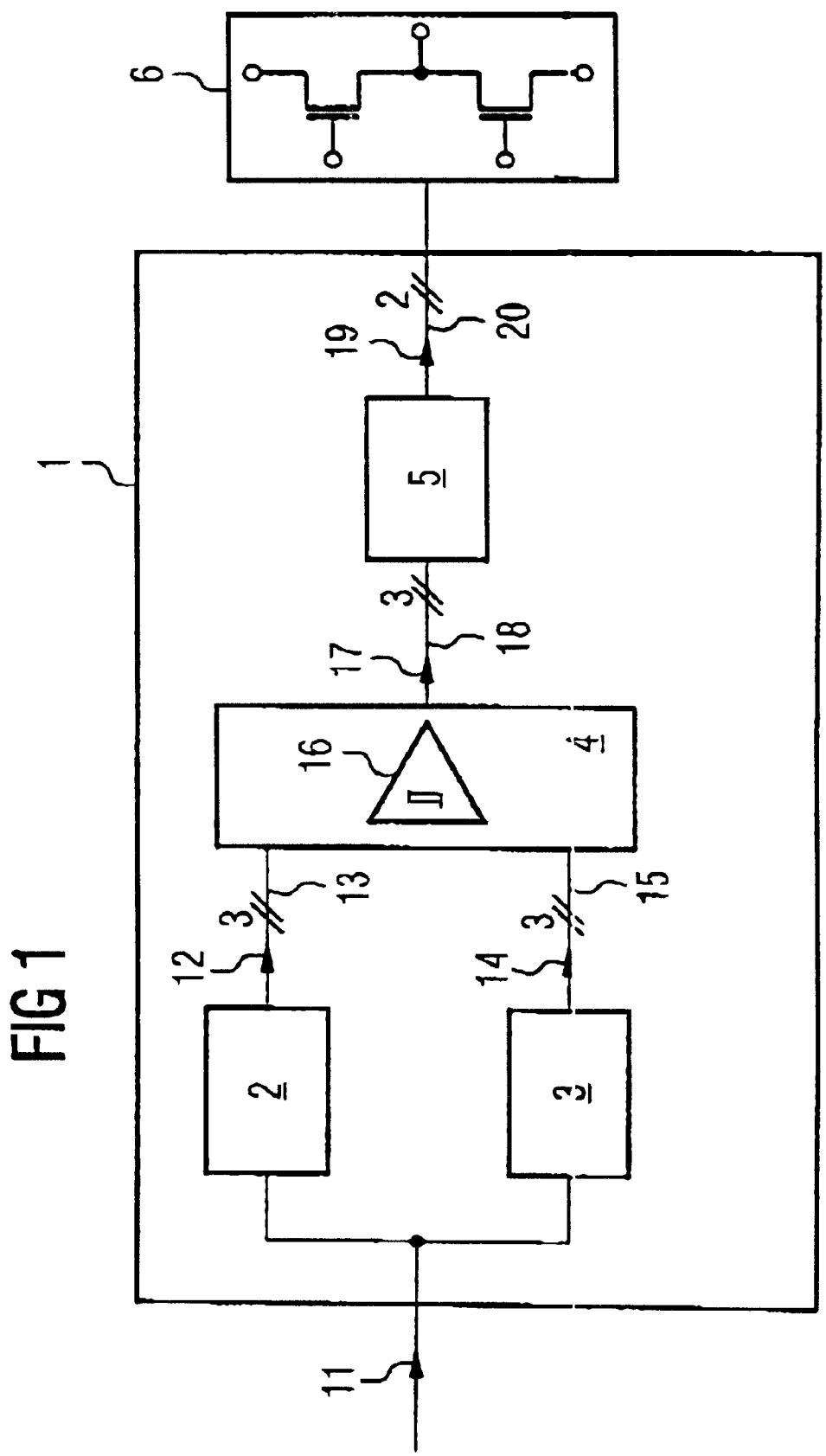

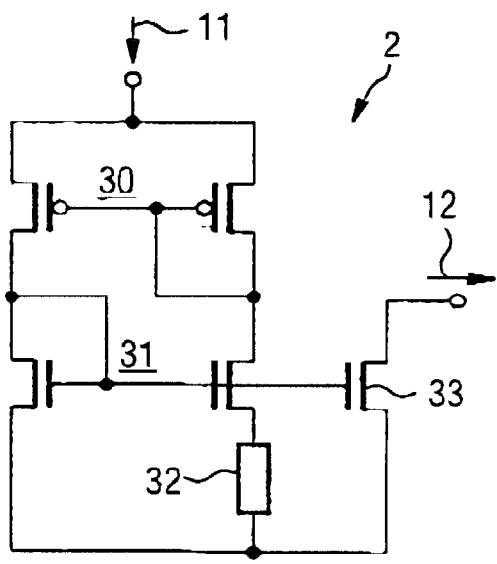
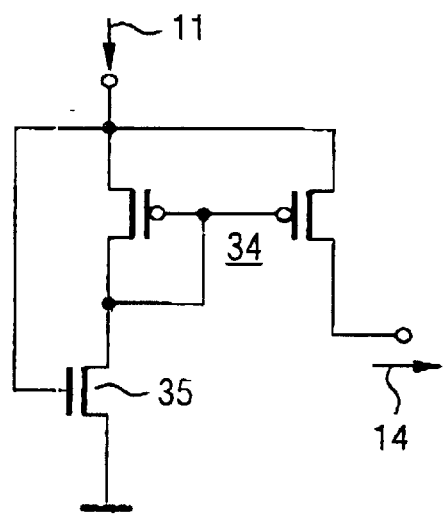
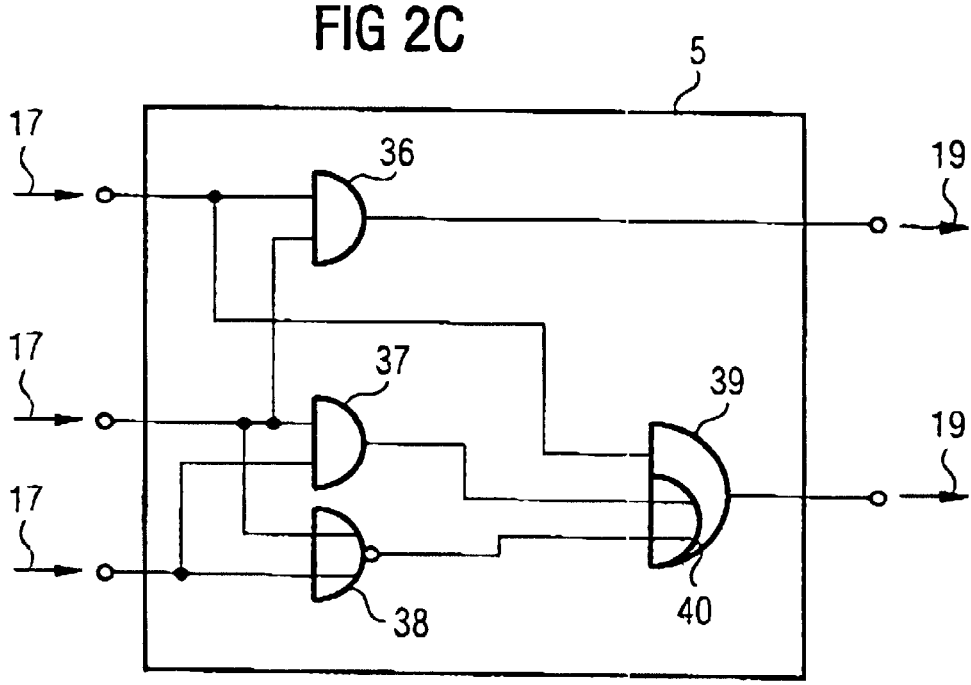

COMPENSATION CIRCUIT FOR DRIVER CIRCUITS

The invention relates to a compensation circuit for driver circuits.

The signals of input/output pad cells (I/O pad cell) of an integrated circuit must have a defined, minimum signal edge steepness of the signals passing via the I/O pad cells depending on the specification and/or depending on the desired requirement. Owing to temperature, voltage and process fluctuations, it is, however, possible for more or less pronounced diffusions of the signal edge steepness to occur. Owing to these, driver circuits for I/O pad cells must be configured in such a way that minimum signal edge steepness can be guaranteed even in what is referred to as the "worst case" i.e. at a very high temperature and with the low supply voltage and "slow" process parameters.

Hitherto, driver circuits have been used for this which simultaneously fulfill all the abovementioned requirements. The resulting driver circuits are, however, overdimensioned for most temperature, voltage and process values, giving rise to an increased "ground supply bounce" which can negatively influence the operational capability of the entire integrated circuit and in the worst case lead to malfunctions.

The present invention is therefore based on the object of disclosing a compensation circuit for driver circuits which ensure a defined minimum signal edge steepness of a signal in the case of I/O pad cells even under unfavorable conditions.

This object is achieved according to the invention by means of a compensation circuit for driver circuits having the features of patent claim 1.

Advantageous refinements and developments of the invention are the subject matter of the subclaims.

According to the invention, a digitally controlled compensation circuit or compensation unit (DCCU) is provided for this and is connected upstream of the driver circuit. This compensation unit according to the invention is composed essentially of four circuit parts: a current reference source, a current-comparison source, a comparator stage and a logic stage. The comparison unit is used to compensate temperature, voltage and process fluctuations in the driver circuit for the I/O pad cells. In this way, the signal edge steepness of the signals passing via these I/O pad cells is monitored and kept approximately constant over the abovementioned fluctuations. Furthermore, this can also permit a considerably reduced "ground supply bounce" to be achieved.

The invention is explained in more detail below with reference to the exemplary embodiments disclosed in the figures of the drawing, in which:

FIG. 1 shows a basic block circuit diagram of the compensation unit according to the invention;

FIG. 2 comprises detailed circuit diagrams of parts of the compensation unit.

In the figures for the drawing, identical or functionally identical elements are provided with identical reference symbols unless otherwise stated.

FIG. 1 shows a block circuit diagram of a compensation unit according to the invention which is designated by 1 here. The compensation unit 1 according to the invention is composed essentially of four circuit parts: a current reference source 2, a current-comparison source 3, a comparator stage 4 and a logic stage 5. The current reference source 2 and the current-comparison source 3 are connected in parallel with one another and connected to the inputs of the comparator stage 4 at the output end. The logic stage 5 is connected downstream of the comparator stage 4 at the output end. At least one driver circuit 6 is connected downstream of the logic stage 5, and thus of the compensation circuit 1, at the output end.

The current reference source 2 generates, from an input signal 11, a reference current which increases as the temperature or supply voltage rises and decreases as the temperature or supply voltage drops. This reference current is divided by means of a current mirror into three identical reference currents 12 which are conducted out of the current reference source 2 via three current branches 13.

The current-comparison source 3 has a temperature characteristic which is inversely proportional to the current reference source 2. The current-comparison source 3 therefore generates from the input signal 11 a comparison current which decreases as the temperature rises and increases as the temperature drops. A current mirror is used to generate from this comparison current three identical comparison currents 14 which are conducted out of the current-comparison source via three current branches 15.

The reference currents 12 and the comparison currents 13 are fed to the comparator stage 4 connected downstream. The comparator stage is composed essentially, in the present exemplary embodiment, of three comparators 16, to each of which one of the three current branches 13 of the current reference source 2 and one of the three current branches 15 of the current-comparison source 3 are fed. Depending on which of the currents 12, 14 is larger in absolute value, each of the three comparators 16 generates at its output a digital output signal 17 with a corresponding HIGH level or LOW level. These digital output signals 17 are conducted out of the comparator stage 4 via three current branches 18.

The comparators 16 of the comparator stage 4 can advantageously be embodied as known precision Schmitt triggers with adaptable switching hysteresis.

The three digital output signals 17 are fed to the logic stage 5. The logic stage 5 contains a multiplicity of logic basic gate circuits which convert the three digital output signals 17 into two digital compensation signals 19. A three-bit output signal 17 is thus logically connected to form a two-bit compensation signal 19. The two-bit compensation signal 19 of the logic stage is fed at the output end to the control terminals of one or more downstream driver circuits 6 via two signal paths 20.

The digital output signals 19 of the compensation unit 1 can, respectively as a function of temperature, voltage and process parameters, assume four different states which switch the driver power of the downstream driver circuit of the I/O pad cells to be actuated. The driver circuit connected downstream of the compensation unit 1 can therefore be actuated in an optimum way as a function of these parameters. The abovementioned enumeration of the parameters, i.e. temperature, voltage and process parameters, is not intended to be viewed here as conclusive, even if these are to be seen as the most relevant. For example, it would also be conceivable to take into account other parameters, such as pressure, humidity, etc., likewise for the generation of a compensation signal.

The compensation unit 1 according to the invention is based on a current comparison, the two current sources, i.e. the current reference source 2 and current-comparison source 3, having a temperature characteristic which is inversely proportional to one another. Essential to the invention here is the fact that the compensation unit 1 is connected to the same supply voltage as the input/output pad cells. This ensures that the compensation unit 1 attains the same voltage dependence as the I/O pad cells. The temperature characteristic of an integrated circuit is approximately the same at each port, as a result of which virtually the same temperature characteristic is obtained for the I/O pad cells and the compensation unit 1.

In a development, the compensation unit 1 can also be activated or deactivated by means of a further input port or an enable port (not illustrated in FIG. 1).

The exemplary embodiment according to FIG. 1 shows a preferred implementation of the compensation unit 1 according to the invention. However, it would also of course be possible to modify this in a wide variety of ways.

For example, it would also be conceivable to make a available a one-bit or three-bit or multi-bit compensation signal 19 at the output of the compensation unit 1. In addition, the compensation or reference currents 12, 14 do not necessarily need to be composed of three currents, instead it would also be conceivable to make available a greater or smaller number of comparison/reference currents 12, 14. The only essential feature here is that the number of comparison currents 12 and that of reference currents 14 are identical. However, the refinements just described may be more difficult or costly to implement in terms of circuitry.

FIG. 2 gives brief descriptions of detailed circuit diagrams for a number of circuit components of the compensation unit 1 in typical embodiments.

FIG. 2*a* shows the circuitry design of a current reference source 2. The current reference source 2 is typically composed of two current mirrors 30, 31 which are each arranged with their load paths in series and in a complementary fashion to one another. The two current mirrors 30, 31 each have MOS transistors of the opposite type. In addition, a resistive element 32, for example a resistor, is arranged in one of the load paths of the current mirrors 30, 31 arranged in series. At the output end, there is also a MOS output transistor 33 provided whose load path is connected in series with the load paths of the current mirror 30, 31 and whose control port is connected to a control port of a current mirror 31. The reference current 12 can then be tapped at the output of the current reference source 2 and then, as already mentioned, divided into three equally large reference currents 12 by means of current mirrors (not illustrated in FIG. 2*a*).

The current reference source 2 therefore generates from the input signal 11 a reference current 12 which increases as the temperature rises. It is therefore necessary for the gate potentials of the transistors 30, 31, 33 of the current reference source 2 always to have a defined potential which is unequal to zero so that a temperature fluctuation can also be detected in a defined way.

According to FIG. 2*b,* the current-comparison source 3 is typically composed of a simple current mirror 34 and an individual transistor 35 which is arranged in series with the load current input of the current mirror 34. The current mirror 34 and the transistor 35 typically have MOS transistors of the opposite type. These MOS transistors have a similar temperature characteristic to the transistors of the pre-driver stage which controls the speed of the driver circuit 6.

The logic stage 5 in FIG. 2c modulates only the digital three-bit output signals 17 of the comparator stage 4 into a two-bit compensation signal 19, which also constitutes the output signal of the compensation unit 1. This three-bit/two-bit signal modulation is easily possible using different logic basic gate circuits 36 . . . 40. The signals are modulated by means of three AND gates 36, 37, 39 of an OR gate 38 and of a NOR gate 40.

LIST OF REFERENCE NUMERALS

1 Compensation circuit, compensation unit
2 Current reference source
3 Current-comparison source
4 Comparator stage, comparison unit
5 Logic stage
6 Driver circuit
11 Input signal
12 Reference currents
13,15,18,20 Current branches
14 Comparison currents
16 Comparators
17 (Digital) output signal
19 (Digital) compensation signal
30,31,34 Current mirror
32 Resistive element, resistor
33 Load transistor, output transistor
35 Transistor
36,37,39 AND gate circuits
38 Or gate circuit
40 NOR gate circuit

What is claimed is:

1. A compensation circuit which can be connected upstream of a driver circuit,
    having a signal reference source, which generates from an input signal at least one reference signal, the reference signal having a parameter-dependence,
    having a signal-comparison source which generates from the input signal at least one comparison signal, the comparison signal having an inverse parameter-dependence to that of the reference signal,
    having a comparison unit to which the reference signal and the comparison signal can be fed and which generates at least one digital output signal from a compression of the reference signal and of the comparison signal, wherein the signal reference source generates a reference current as a reference signal, and the signal-comparison source generates a comparison current as a comparison signal, wherein the signal reference source and the signal-comparison source each generate a plurality of equally large reference signals or comparison signals which can each be fed into a corresponding number of comparators of the comparison unit makes available therefrom a number of digital output signals corresponding to the number of comparators.

2. The compensation circuit as claimed in claim 1, wherein a logic circuit is provided to which the digital output signals of the comparison unit can be fed and which makes available at least one digital compensation signal which is generated from the output signal.

3. The compensation circuit as claimed in claim 2, the logic circuit makes available a digital, two-bit-wide compensation signal at the output end.

4. The compensation circuit as claimed in claim 3, wherein the compensation unit makes available a three-bit-wide output signal.

5. The compensation circuit as claimed in claim 4, wherein a parameter of the signal is the temperature or the supply voltage or at least one process parameter, or a mixture thereof.

6. The compensation circuit as claimed in claim 5, wherein the compensation unit is embodied as a precision Schmitt trigger with adjustable switching hysteresis.

7. The compensation circuit as claimed in claim 6, wherein the signal reference source has transistors whose control terminals each always have a defined potential which is unequal to zero.

8. An output driver circuit,
    having two output transistors whose load paths are arranged in series between a first supply potential and a second supply potential, which has an output at which an output signal can be tapped, and which has an input which is coupled to a compensation circuit as claimed in one of the preceding claims, it being possible to feed a compensated signal to the output driver circuit via the compensation circuit.

* * * * *